United States Patent
Lin et al.

(10) Patent No.: US 9,941,131 B1
(45) Date of Patent: Apr. 10, 2018

(54) METHOD FOR APPLYING DEVELOPER ON SEMICONDUCTOR WAFER

(71) Applicant: Taiwan Semiconductor Manufacturing Co., Ltd., Hsinchu (TW)

(72) Inventors: Ming-Hung Lin, Tainan (TW); Hsiao-Yi Wang, Zhunan Township (TW); Yen-Min Liao, Miaoli (TW); Hsin-Jung Lu, Tainan (TW); Diau-Tang Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/460,580

(22) Filed: Mar. 16, 2017

Related U.S. Application Data (60) Provisional application No. 62/433,553, filed on Dec. 13, 2016.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/306* | (2006.01) |
| *H01L 21/687* | (2006.01) |
| *H01L 23/544* | (2006.01) |
| *B08B 3/04* | (2006.01) |

(52) U.S. Cl.
CPC ........ *H01L 21/30604* (2013.01); *B08B 3/041* (2013.01); *H01L 21/68764* (2013.01); *H01L 23/544* (2013.01); *H01L 2223/54426* (2013.01)

(58) Field of Classification Search
USPC .......................................................... 216/83
See application file for complete search history.

(56) References Cited

U.S. PATENT DOCUMENTS 6,270,579 B1 * 8/2001 Subramanian ........ G03F 7/3028
118/323

* cited by examiner

*Primary Examiner* — Roberts Culbert
(74) *Attorney, Agent, or Firm* — Birch, Stewart, Kolasch & Birch, LLP (57) ABSTRACT

A method for applying developer over a semiconductor wafer is provided. The method includes moving a nozzle over the center of the semiconductor wafer. The nozzle extends across the semiconductor wafer. The method also includes rotating the semiconductor wafer by a dispensing rotation angle that is less than 180 degrees. The method further includes dispensing developer over the semiconductor wafer relative to alignment marks formed on the semiconductor wafer while the semiconductor wafer is rotated by the dispensing rotation angle.

20 Claims, 7 Drawing Sheets

METHOD FOR APPLYING DEVELOPER ON SEMICONDUCTOR WAFER

PRIORITY CLAIM AND CROSS-REFERENCE

This application claims the benefit of U.S. Provisional Application No. 62/433,553, filed on Dec. 13, 2016, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of the semiconductor devices, various processing steps are used to fabricate integrated circuits on a semiconductor wafer. Generally, in a photolithography process, a light source is used to transfer a geometric pattern from a mask to a light-sensitive chemical resist material that is formed on the semiconductor wafer. As a result, an exposure pattern is generated in the resist material. A series of chemical treatments may then be used to etch or otherwise transfer the exposure pattern into one or more thin film layers positioned underneath the resist layer.

Alignment is performed in photolithography process. When the mask is positioned over the wafer, its own alignment marks are aligned with the alignment marks of the wafer. Deposition of material layers on the alignment marks of the wafer may cover or blur the alignment marks and cause misalignment.

Although existing methods and devices for exposing the alignment marks have been generally adequate for their intended purposes, they have not been entirely satisfactory in all respects. Consequently, it would be desirable to provide a solution for removing a material layer from the top of an alignment mark.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Figure 1:
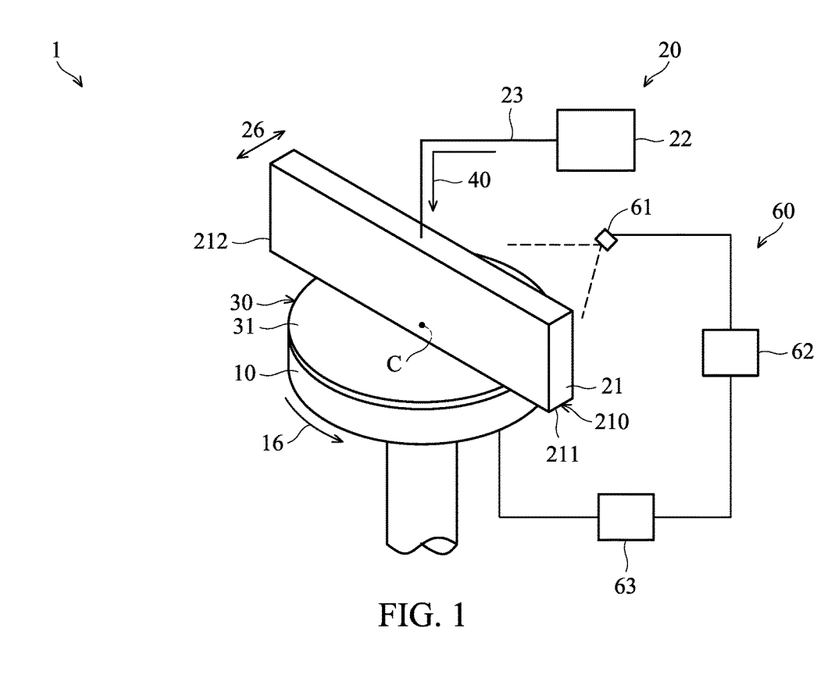
FIG. 1 shows a schematic view of a processing apparatus for processing a substrate, in accordance with some embodiments.

Referring to FIG. 1, a schematic view of a processing apparatus 1 is shown, in accordance with some embodiments. In some embodiments, the processing apparatus 1 includes a substrate stage 10, a dispensing module 20, a semiconductor wafer 30 and a detection unit 60.

In some embodiments, the substrate stage 10 is configured for holding, positioning, moving, and otherwise manipulating the semiconductor wafer 30. The substrate stage 10 is positioned relative to the dispensing module 20 so as to allow the developer from the dispensing module 20 to be applied on the semiconductor wafer 30 arranged on the substrate stage 10.

In some embodiments, the semiconductor wafer 30 is secured on a substrate stage 10 by a clamping mechanism, such as vacuum clamping or e-chuck clamping. In some embodiments, the substrate stage 10 is further designed and configured to be operable for translational and rotational motions. In some embodiments, the substrate stage 10 is further designed operably to tilt or dynamically change the tilt angle relative to an optical axis of the exposure module 10 such that the semiconductor wafer 30 is not perpendicular to the optical axis.

The dispensing module 20 is configured to supply a developer 40 over the semiconductor wafer 30 arranged on the substrate stage 10. In some embodiments, the dispensing module 20 includes a nozzle 21 and a container 22. The nozzle 21 is connected to the container 22 via a conduit 23. Developer 40 contained in the container 22 is applied to the semiconductor wafer 30 via the conduit 23 and the nozzle 21. A relative motion of the semiconductor substrate 30 with respect to the nozzle 21 may be performed by a robotic arm (not shown in figures) as illustrated by the arrow associated with reference numeral 26. The nozzle 21 may be mounted to an arm suspended by a support (not shown) to hold nozzle 21 from above.

As is illustrated within the schematic perspective diagram of FIG. 1, the bottom surface 210 of the nozzle 21 is positioned and spaced parallel from the front surface 31 of the semiconductor substrate 30. In some embodiments, the bottom surface 210 extends a length which is greater than the diameter of semiconductor substrate 30. As a result, when the nozzle 21 is positioned above the center C of the semiconductor substrate 30, the projection of the two ends 211 and 212 of the bottom surface 210 are located outside of the semiconductor substrate 30.

Figure 2A:
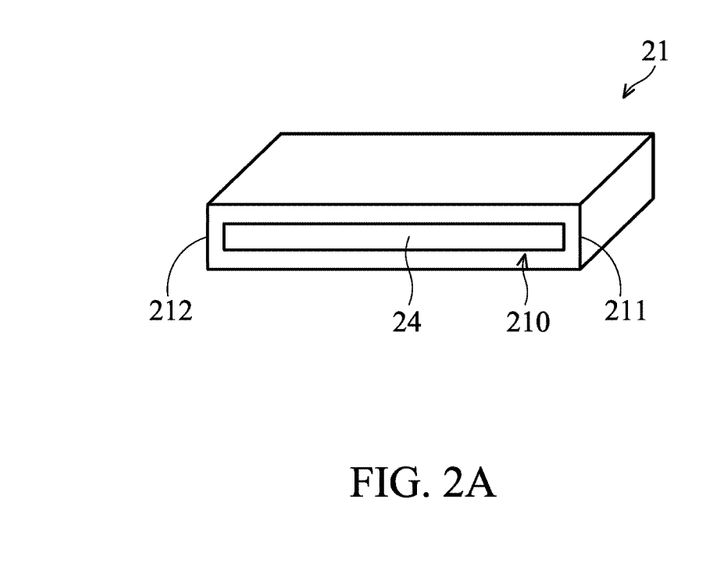
FIG. 2A shows a partial schematic view of a nozzle, in accordance with some embodiments.

FIG. 2A shows schematic view of the nozzle 21, in accordance with some embodiments. In some embodiments, a slit 24 for supplying the developer 40 is formed on the bottom surface 210 of the nozzle 21. The slit 24 extends from one end 211 to the opposite end 212 and has a rectangular cross section. However, it should be appreciated that many variations and modifications can be made to embodiments of the disclosure. In some other embodiment, two or more slits or openings are formed on the bottom surface 210 and spaced apart from one another.

Figure 2B:
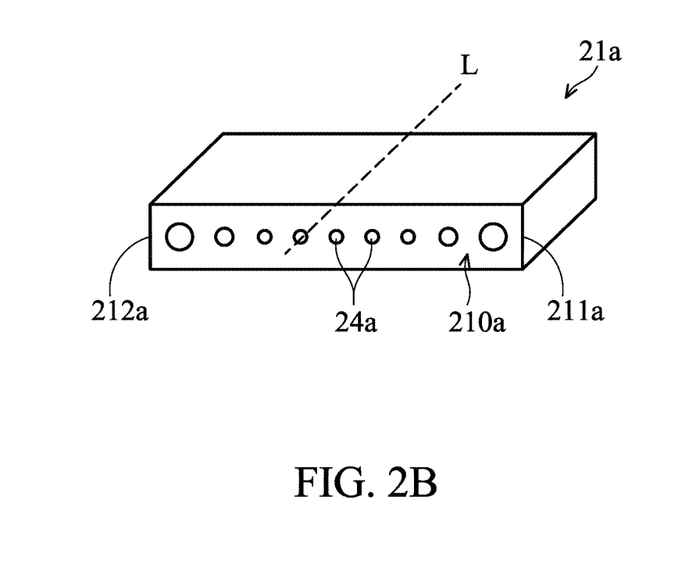
FIG. 2B shows a partial schematic view of a nozzle, in accordance with some embodiments.

FIG. 2B shows schematic view of the nozzle 21a, in accordance with some embodiments. In some embodiments, a number of openings 24a are formed on the bottom surface 210a of a nozzle 21a. The openings 24a are arranged from an axis L to the ends 211a and 212a along two opposite directions. In some embodiments, in a direction from the axis L to the ends 211a, the width of the opening gradually increases. Consequently, the volume flow rate of the developer in the central region (i.e., region adjacent to the axis L) of the bottom surface 210a is less than that in the peripheral region (i.e., regions adjacent to the ends 211a and 212a) of the bottom surface 210a. The advantages produced by this feature will be described in later embodiments.

The detection unit 60 is used to detect the orientation of the semiconductor wafer 30. The detection unit 60 may include a camera 61, such as a charge-coupled device (CCD), an image processor 62, and a control module 63.

The camera 61 is used to investigate particular objects or locations in the processing apparatus 1. In some embodiments, the camera 61 includes a charge-coupled device (CCD). The CCD is a highly sensitive photon detector. The CCD is divided into a large number of small, light-sensitive areas (known as pixels) which can be used to build up an image of the scene of interest. A photon of light that falls within the area defined by one of the pixels will be converted into one (or more) electrons, and the number of electrons collected will be directly proportional to the intensity of the scene at each pixel. When the CCD is clocked out, the number of electrons in each pixel are measured and the scene can be reconstructed.

The image processor 62 is connected to the camera 61 to receive the electronic signal from the camera 61. Then the image processor 62 analyzes the image to produce image information data regarding the image investigated by the camera 61.

The control module 63 is configured to send control data to the wafer stage 10. The wafer stage 10 is operated according to the control data to change the orientation of the semiconductor wafer 30 positioned on the wafer stage 10. In some embodiments, the control data from the control module 63 is related to the image information data from the image processor 62.

Figure 3:
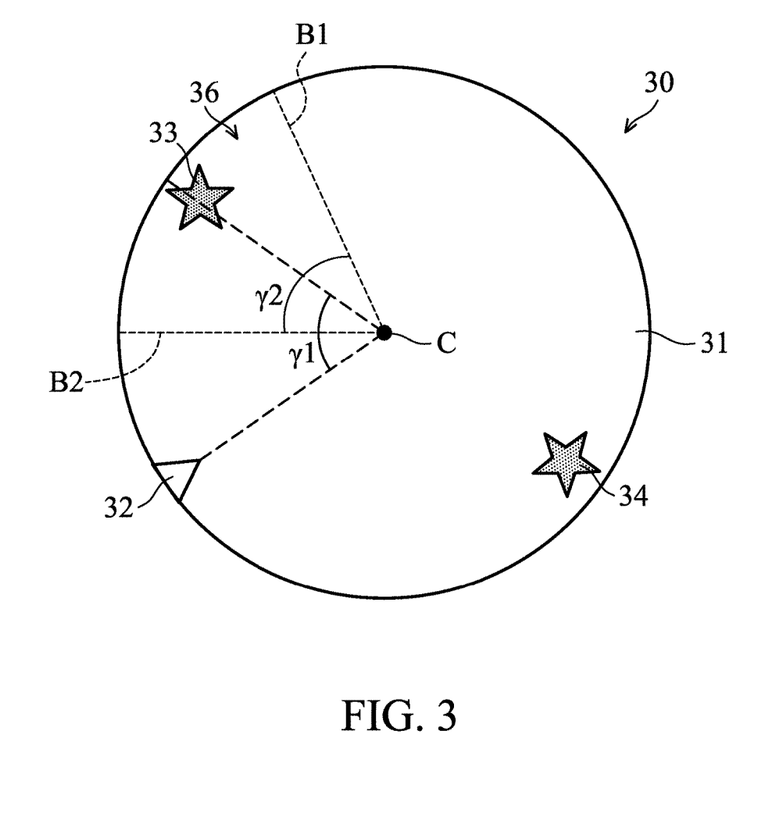
FIG. 3 shows a top view of a semiconductor wafer, in accordance with some embodiments.

FIG. 3 shows a top view of the semiconductor wafer 30, in accordance with some embodiments of the present disclosure. The semiconductor wafer 30 may be made of silicon or other semiconductor materials. Alternatively or additionally, the semiconductor wafer 30 may include other elementary semiconductor materials such as germanium (Ge). In some embodiments, the semiconductor wafer 30 is made of a compound semiconductor such as silicon carbide (SiC), gallium arsenic (GaAs), indium arsenide (InAs), or indium phosphide (InP). In some embodiments, the semiconductor wafer 30 is made of an alloy semiconductor such as silicon germanium (SiGe), silicon germanium carbide (SiGeC), gallium arsenic phosphide (GaAsP), or gallium indium phosphide (GaInP). In some other embodiments, the wafer 30 may be a silicon-on-insulator (SOI) or a germanium-on-insulator (GOI) substrate.

A notch 32 and two zero-layer alignment marks 33 and 34 are formed on the semiconductor wafer 30. The notch 32 is formed at the outer circumference of the semiconductor wafer 30. In some embodiments, the zero-layer alignment mark 33 is spaced apart from the notch 32 by a preset angle r1 of about 50 degrees to about 60 degrees. In some embodiments, the preset angle r1 is about 55 degrees. The zero-layer alignment mark 34 is positioned at an opposite side of the zero-layer alignment mark 33 relative to the center C of the semiconductor wafer 30.

In some embodiments, the two zero-layer alignment marks 33 and 34 are formed by etching into the front surface 31 of the semiconductor wafer 30. The two zero-layer alignment marks 33 and 34 may have a depth from about 1150 Å to about 1250 Å and have a width from about 7.8 μm to about 8.2 μm. However, the dimensions of the two zero-layer alignment marks 33 and 34 should not be limited thereto. The zero-layer alignment marks 33 and 34 can be any convenient shape and dimensions which are able to reflect a detection signal from a detection module (not shown in figures).

The zero-layer alignment marks 33 and 34 are used to diffract a laser alignment beam generated by a photolithography machine (not shown in figures), commonly known as a wafer stepper, during the masking process. The diffraction pattern is received by the wafer stepper and the relative position of the semiconductor wafer 30 and the photolithographic mask (not shown in figures) is adjusted accordingly so that the patterns for the photolithographic mask are transferred to the semiconductor wafer 30 in the precisely the desired location.

In some embodiments, a first boundary line B1 and a second boundary line B2 are defined on the semiconductor wafer 30. The first boundary line B1 and the second boundary line B2 are positioned at two sides of the zero-layer alignment mark 33. The first boundary line B1 and the second boundary line B2 may be separated from the zero-layer alignment mark 33 by the same distance or different angles in a circumferential direction of the semiconductor wafer 30.

The first boundary line B1 and the second boundary line B2 extend from the center C of the semiconductor wafer 30 to the outer circumference 35 of the semiconductor wafer 30. A fan-shaped region 36 is constituted by the first boundary line B1, the second boundary line B2 and the outer circumference 35 of the semiconductor wafer 30. The central angle r2 of the fan-shaped region 36 is less than 180 degrees. In some embodiments, the central angle of the fan-shaped region 36 is in a range from about 30 degrees to about 40 degrees. In some embodiments, the central angle of the fan-shaped region 36 is about 36 degrees. The zero-layer alignment mark 33 is located within the fan-shaped region 36.

In some embodiments, the semiconductor wafer 30 includes one or more material layers formed over the zero-layer alignment marks 33 and 34. For example, the semiconductor wafer 30 includes material layers, such as an oxide layer, a nitride oxide layer, an epitaxy layer, and/or an isolation layers overlying a bulk semiconductor. Since the zero-layer alignment marks 33 and 34 are covered by the material layers, alignment of the photolithographic mask and the semiconductor wafer 30 in photolithography process cannot be properly performed.

In order to overcome the problem of non-readable alignment marks where an oxide or other layer covers the alignment marks, the alignment marks are uncovered by using a "window mask" process before the alignment of the photolithographic mask and the semiconductor wafer 30. In the window mask process, a photoresist layer over the alignment marks are removed by a developer and the rest of the semiconductor wafer is covered by a photoresist layer. Afterwards, the layers over the alignment marks are etched away using the photoresist layer as an etch barrier. Therefore, the alignment marks are clear and uncovered. Details for applying developer over the semiconductor wafer 30 in the widow mask process are described below.

Figure 4:
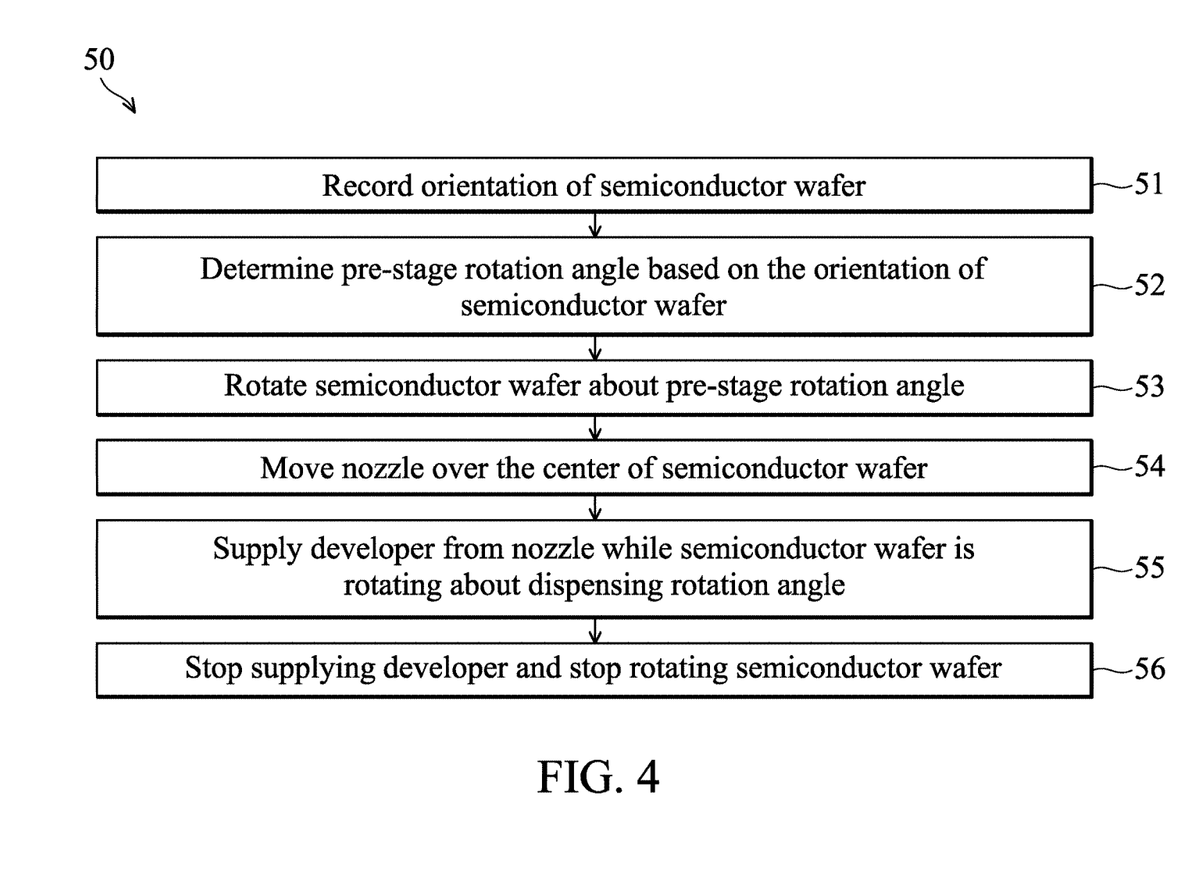
FIG. 4 shows a flow chart illustrating a method for supplying dispenser over a semiconductor wafer, in accordance with some embodiments.

FIG. 4 is a flow chart illustrating the method 50 to expose zero-layer alignment marks 33 and 34, in accordance with some embodiments. For illustration, the flow chart will be described to accompany the schematic view shown in FIGS. 1 and 5A-5F. Some of the described stages can be replaced or eliminated in different embodiments. Additional features can be added to the semiconductor device structure. Some of the features described below can be replaced or eliminated in different embodiments.

According to some embodiments, the processing apparatus 1 is used to perform method 50, and during the dispensing of the developer 40, the position of the nozzle 21 for supplying the developer 40 is fixed, and the semiconductor wafer 30 is rotated by stage 10. In order to apply developer 40 over particular regions of the semiconductor wafer 30 where the zero-layer alignment marks 33 and 34 are located, a pre-stage rotating procedure may be conducted if the zero-layer alignment marks 33 and 34 are not positioned under the nozzle 21 or around to the nozzle 21. The pre-stage rotating procedure can be performed manually or automatically. In cases where the pre-stage rotating procedure is performed automatically, operations 51, 52 and 53 of method 50 are executed.

In operation 51, the semiconductor wafer 30 is transferred to the substrate stage 10 and the orientation of the semiconductor wafer 30 on the substrate stage 10 is recorded according to a position of a feature, such as notch 32. In some embodiments, when the semiconductor wafer 30 is positioned on the substrate stage 10, an image of the semiconductor wafer 30 is recorded by the camera 61. The image data is subsequently delivered to the image processor 62 for analyzing the position of the notch 32. Afterwards, the analyzed results from the image processor 62 are transmitted to the control module 63 for recording.

In method 52, a pre-stage rotation angle r0 (FIG. 5A) is determined by calculating the difference in angle between the notch 32 of the semiconductor wafer 30 and a star point SP. In some embodiments, the star point SP is selected based on the position of the zero-layer alignment mark 33. Specifically, the star point SP is located at a position where the notch 32 of the semiconductor wafer 30 is located when the first boundary line B1 of the semiconductor wafer 30 is aligned with a traversal line T. The traversal line T passes through the center C of the semiconductor wafer 30 and is perpendicular to the moving direction 26 of the nozzle 21.

Figure 5A:
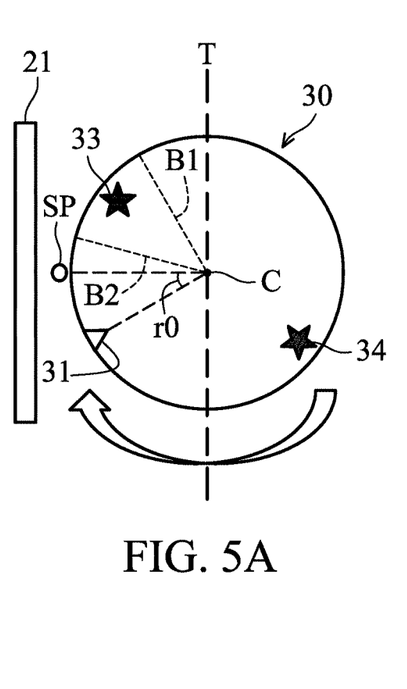
FIG. 5A shows a schematic view of one stage of a method for supplying dispenser over a semiconductor wafer before the semiconductor wafer is rotated a pre-stage rotation angle and as a nozzle stays at a first side of the semiconductor wafer, in accordance with some embodiments.
Figure 5B:
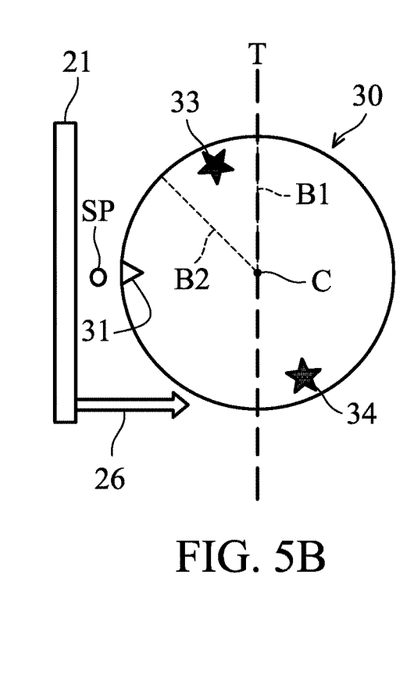
FIG. 5B shows a schematic view of one stage of a method for supplying dispenser over a semiconductor wafer after the semiconductor wafer is rotated a pre-stage rotation angle, in accordance with some embodiments.

In method 53, the semiconductor wafer 30 is rotated about the pre-stage rotation angle r0 to make the notch 32 of the semiconductor wafer 30 face the star point SP and make the first boundary line B1 align with the traversal line T, as shown in FIGS. 5A and 5B.

However, it should be appreciated that many variations and modifications can be made to embodiments of the disclosure. In some embodiments, when the calculated pre-stage rotation angle r0 is less than a preset value, method 53 is omitted. For example, the operation 53 is skipped when the calculated pre-stage rotation angle r0 is less than the difference in the angle between the first boundary line B1 and the zero-layer alignment mark 33.

Figure 5C:
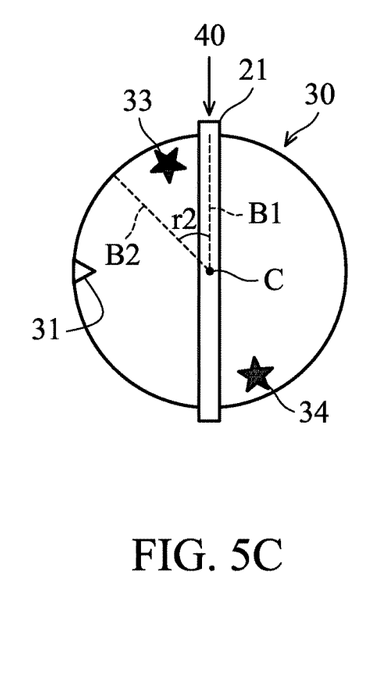
FIG. 5C shows a schematic view of one stage of a method for supplying dispenser over a semiconductor wafer as a nozzle is positioned over the center of the semiconductor wafer, in accordance with some embodiments.

After the pre-stage rotating procedure, the method continues to operation 54 in which the nozzle 21 is moved over the center of the semiconductor wafer 30. In some embodiments, the nozzle 21 is moved from a first side (left hand side of the drawing) of the semiconductor wafer 30 to the center C of the semiconductor wafer 30 along the predetermined direction 26, as shown in FIGS. 5B and 5C. When the nozzle 21 is positioned over the center C of the semiconductor 30, the projection of the nozzle 21 over the semiconductor wafer 30 is aligned with the traversal line T and/or the first boundary line B1.

In some embodiments, to avoid the generation of air bubbles in the developer liquid dispensed, the nozzle 21 is positioned very close to the surface of the semiconductor wafer 30. For instance, a distance of approximately 1.5 mm is normally maintained so that the developer can be dispensed on the wafer surface without a long travel distance.

It should be appreciated that many variations and modifications can be made to embodiments of the disclosure. In some embodiments, the operation 54 and the above mentioned pre-stage rotating procedure can be conducted simultaneously. For example, the operation 53 for rotating the semiconductor wafer 30 and the operation 54 for moving the nozzle 21 are conducted at the same time.

The method continues to operation 55 in which, as shown in FIG. 5C, the developer 40 is continuously supplied from the nozzle 21 and in the meantime the semiconductor wafer 30 is rotated about a dispensing rotation angle. In some embodiments, the dispensing rotation angle is equal to the angle r2 formed between the first boundary line B1 and the second boundary line B2.

Figure 5D:
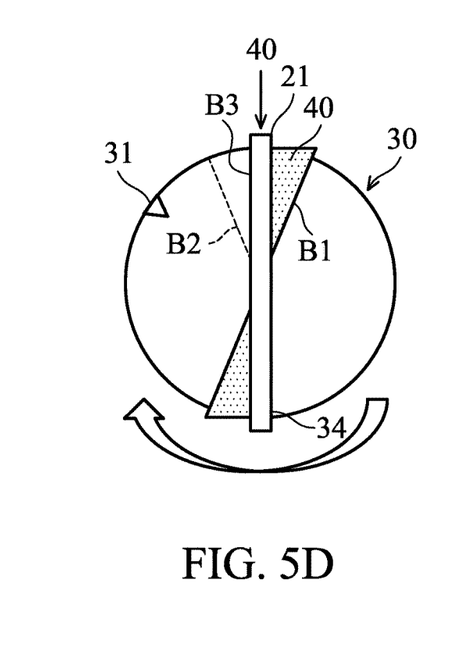
FIG. 5D shows a schematic view of one stage of a method for supplying dispenser over a semiconductor wafer while the dispenser is supplying on the semiconductor wafer, in accordance with some embodiments.

As shown in FIG. 5D, during the operation 55, the nozzle 21 passes over the zero-layer alignment marks 33 and 34, and hence the zero-layer alignment marks 33 and 34 are covered by the developer 40. After the nozzle 21 passes over the zero-layer alignment marks 33 and 34, the rotation of the semiconductor wafer 30 continues. The processing time for dispensing the developer 40 may less than 1 second. In one exemplary embodiment, the processing time for dispensing the developer 40 is about 0.7 seconds. In some embodiments, the nozzle 21 remains stationary and positioned over the center C of the semiconductor wafer 30 while the semiconductor wafer 30 is rotated.

Figure 5E:
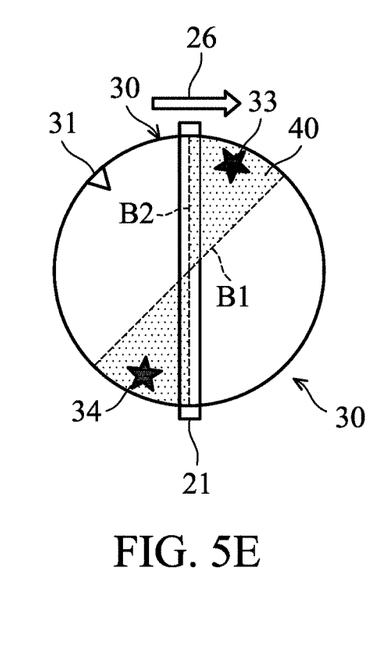
FIG. 5E shows a schematic view of one stage of a method for supplying dispenser over a semiconductor wafer after the dispenser is supplying on the semiconductor wafer, in accordance with some embodiments.

The method 50 continues to operation 56 in which, as shown in FIG. 5E, the rotation of the semiconductor wafer 30 and the supply of the developer 40 is stopped. In some embodiments, when the semiconductor wafer 30 is stopped from rotating, the projection of the nozzle 21 over the semiconductor wafer 30 is aligned with the boundary line B2.

The method 50 continues to operation 57 in which, the nozzle 21 is removed from the semiconductor wafer 30. In some embodiments, the nozzle 21 is moved from the center C of the semiconductor wafer 30 to a second side (right hand side of the drawing) of the semiconductor wafer 30 which is opposite to the first side along the predetermined direction 26, as shown in FIGS. 5E and 5F.

In some embodiments, when the nozzle 21 is positioned at the second side, the nozzle 21 is lowered into a cleaning bath 25. The nozzle 21 is cleaned in the cleaning bath 25 to prevent clogging of the nozzle 21 or deposition from the nozzle 21 of a particulate residue up the semiconductor wafer 30.

Figure 5F:
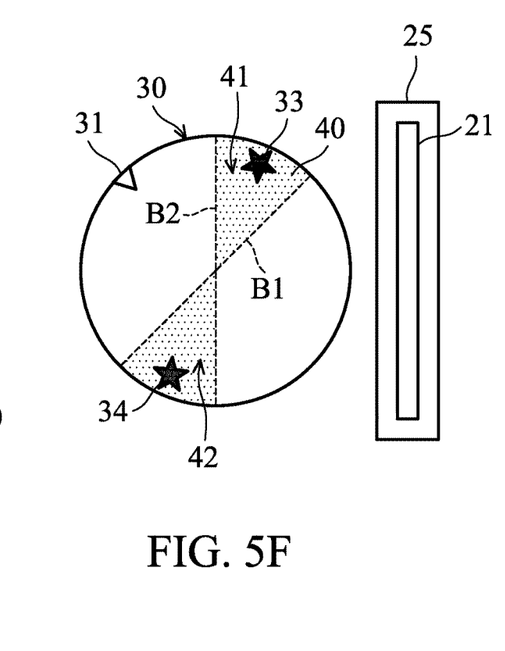
FIG. 5F shows a schematic view of one stage of a method for supplying dispenser over a semiconductor wafer as a nozzle is moved to a second side of the semiconductor wafer, in accordance with some embodiments.

As shown in FIG. 5F, after the dispensing of the developer 40 over the semiconductor wafer 30, most of the area of the semiconductor wafer 30 is free of the developer 40. In one exemplary embodiment, about 20% of the area of the semiconductor wafer 30 is covered by the developer 40, and the remaining 80% of the area of the semiconductor wafer 30 is free of the developer 40.

In some embodiments, since the nozzle 21 extends across semiconductor wafer 30 and is positioned over the center C of the semiconductor wafer 30, the pattern of the developer 40 on the semiconductor wafer 30 comprises two fan-shaped portions 41 and 42. The two fan-shaped portions 41 and 42 may be symmetrical to the center C of the semiconductor wafer 30 and has the same area. In some embodiments, the edges of the fan-shaped portion 41 which covers the zero-layer alignment mark 33 are aligned with the first boundary line B1 and the second boundary line B2.

In cases where the nozzle 21 shown in FIG. 2A is used to dispense the developer 40, the thickness of the developer 40 formed on a center region of the semiconductor wafer 30 may be greater than the thickness of the developer 40 formed on an edge region of the semiconductor wafer 30 due to the fact that the slit 24 has a uniform width.

Figure 6:
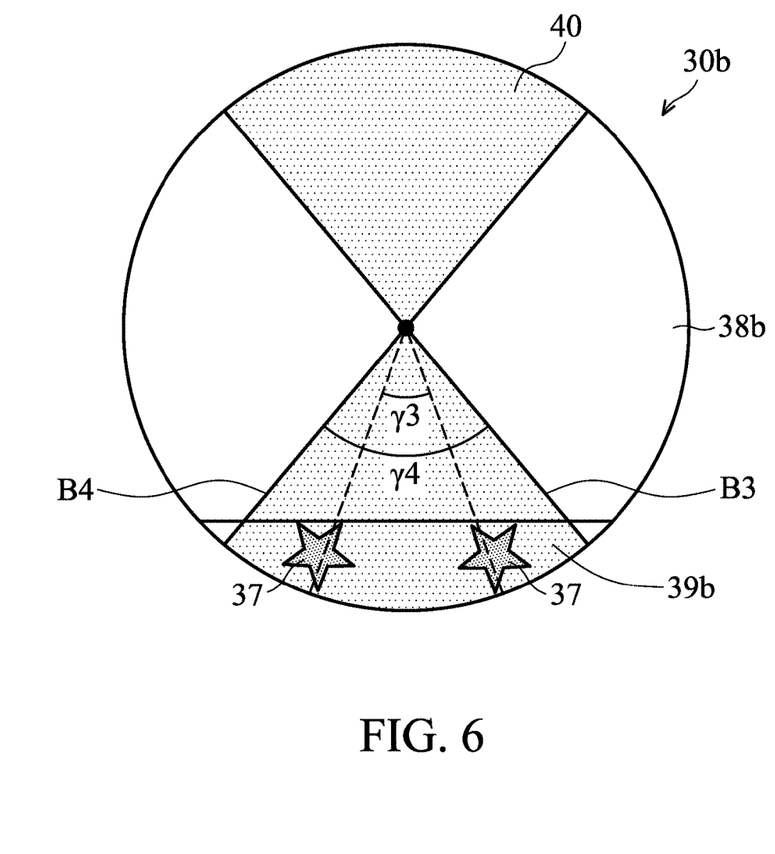
FIG. 6 shows a top view of a semiconductor wafer, in accordance with some embodiments.

FIG. 6 shows a top view of a semiconductor wafer 30b, in accordance with some embodiments. In some embodiments, the semiconductor wafer 30b has an active region 38b and an edge region 39b. In some embodiments, one or more alignment marks (such as two alignment marks 37) are formed on the edge region 39b. An included angle r3 that is formed between the two alignment marks 37 in a circumferential direction of the semiconductor wafer 30 is between about 12 degrees and about 36 degrees.

The two alignment marks 37 may have a depth from about 1150 Å to about 1250 Å. The alignment marks 37 have a width from about 7.8 to 8.2 μm. However, the dimension of the two alignment marks 37 should not be limited thereto. The alignment marks 37 can be any convenient shape and dimensions which are able to reflect a detection signal from the detection module 40.

In some embodiments, the method for exposing zero-layer alignment marks 37 is similar to the method 50 shown in FIG. 4. Therefore, some of the operations will not be repeated herein for brevity. Differences between these two methods include the operation 55 of rotating the semiconductor wafer 30 about a dispensing rotation angle.

In some embodiments, the dispensing rotation angle is equal to an included angle r4 that is formed between the boundary line B3 and boundary line B4 in a circumferential direction of the semiconductor wafer 30. The two zero-layer alignment marks 37 are located between the boundary line B3 and boundary line B4. The included angle r4 is greater than the angle r3 formed between the two zero-layer alignment marks 37.

Dispenser 40 is started to be applied over the semiconductor wafer 30 when the nozzle (not shown in FIG. 5) is aligned with boundary line B3, and the dispenser is stopped applying when the nozzle is aligned with boundary line B4. As a result, the nozzle 21 passes over the two zero-layer alignment marks 37, and hence the two zero-layer alignment marks 37 are covered by the developer 40.

Embodiments of a semiconductor wafer processing method for exposing alignment marks on zero-layer supplying are provided. The developer is applied over partial regions of the semiconductor wafer where the alignment marks are located rather than the entire area of the semiconductor wafer. As a result, a small amount of developer is used to expose the alignment mark. Compared with the conventional method which applies developer over the entire area of the semiconductor wafer, the disclosed method saves at least 80 percent of developer used, and the amount of hazardous waste is also reduced. In addition, the method provides a quick way to complete the exposure of the alignment marks. Therefore, the tool capacity of the process apparatus is extended.

In accordance with some embodiments a method for applying developer over a semiconductor wafer is provided. The method includes moving a nozzle over the center of the semiconductor wafer. The nozzle extends across the semiconductor wafer. The method also includes rotating the semiconductor wafer by a dispensing rotation angle that is less than 180 degrees. The method further includes dispensing developer over the semiconductor wafer relative to alignment marks formed on the semiconductor wafer while the semiconductor wafer is rotated by the dispensing rotation angle.

In accordance with some embodiments a method for applying developer over a semiconductor wafer is provided. The method includes, recording an orientation of a feature formed on the semiconductor wafer. The method also includes determining a pre-stage rotation angle of the semiconductor wafer according to the recorded orientation. The method further includes rotating the semiconductor wafer about the pre-stage rotation angle. In addition, the method includes dispensing the developer by a nozzle positioned over the center of the semiconductor wafer after the semiconductor wafer is rotated about the pre-stage rotation angle. The method further includes rotating the semiconductor wafer about a dispensing rotation angle while the developer is dispensed from the nozzle.

In accordance with some embodiments a method for applying developer over a semiconductor wafer having at least one zero-layer alignment mark formed thereon is provided. The method includes positioning a nozzle over the semiconductor wafer. The method also includes dispensing a developer over the semiconductor wafer by the nozzle. The method further includes moving the semiconductor wafer to change the projection of the nozzle on the semiconductor wafer from a first boundary line to a second boundary line while the developer is dispensed by the nozzle. The first boundary line and the second boundary line are located at two sides of the zero-layer alignment mark in a circumferential direction of the semiconductor wafer.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for applying developer over a semiconductor wafer, comprising:
    moving a nozzle over the center of the semiconductor wafer, wherein the nozzle extends across the semiconductor wafer;
    rotating the semiconductor wafer by a dispensing rotation angle that is less than 180 degrees; and
    dispensing developer over the semiconductor wafer relative to zero-layer alignment marks formed on the semiconductor wafer while the semiconductor wafer is rotated by the dispensing rotation angle.

2. The method as claimed in claim 1, wherein the dispensing rotation angle of the semiconductor wafer is in a range from about 30 degrees to about 40 degrees.

3. The method as claimed in claim 1, wherein about one-tenth of the area of the semiconductor wafer is covered by the developer.

4. The method as claimed in claim 1, wherein the processing time for dispensing the developer is less than 1 second.

5. The method as claimed in claim 1, wherein the semiconductor wafer comprises two zero-layer alignment marks, a pattern of the developer on the semiconductor wafer comprises two fan-shaped portions, and the two zero-layer alignment marks are covered by the two fan-shaped portions.

6. The method as claimed in claim 1, wherein the thickness of the developer formed on a center region of the semiconductor wafer is greater than the thickness of the developer formed on an edge region of the semiconductor wafer.

7. The method as claimed in claim 1, further comprising moving the nozzle to a second side of the semiconductor wafer after the dispensing of the developer, wherein the second side is opposite to a first side of the semiconductor wafer where the nozzle is located before the dispensing of the developer.

8. A method for applying developer over a semiconductor wafer, comprising:
    recording an orientation of a feature formed on the semiconductor wafer;
    determining a pre-stage rotation angle of the semiconductor wafer according to the recorded orientation;
    rotating the semiconductor wafer about the pre-stage rotation angle;
    dispensing the developer by a nozzle positioned over the center of the semiconductor wafer after the semiconductor wafer is rotated about the pre-stage rotation angle; and
    rotating the semiconductor wafer about a dispensing rotation angle while the developer is dispensed from the nozzle.

9. The method as claimed in claim 8, wherein the dispensing rotation angle of the semiconductor wafer is in a range from about 30 degrees to about 40 degrees.

10. The method as claimed in claim 8, wherein about one-tenth of the area of the semiconductor wafer is covered by the developer.

11. The method as claimed in claim 8, wherein the processing time for dispensing the developer is less than 1 second.

12. The method as claimed in claim 8, wherein the semiconductor wafer comprises two zero-layer alignment marks, a pattern of the developer on the semiconductor wafer comprises two fan-shaped portions, and the two zero-layer alignment marks are covered by the two fan-shaped portions.

13. The method as claimed in claim 12, wherein edges of each of the two fan-shape portions are located at the outer circumference of the semiconductor wafer and two boundary lines extending from the center of the semiconductor wafer to the outer circumference;
    wherein the zero-layer alignment marks are spaced apart from the two boundary lines by different distances.

14. The method as claimed in claim 8, further comprising moving the nozzle to a second side of the semiconductor wafer after the dispensing of the developer, wherein the second side is opposite to a first side of the semiconductor wafer where the nozzle is located before the dispensing of the developer.

15. The method as claimed in claim 8, wherein the rotation of the semiconductor wafer about the pre-stage rotation angle is immediately conducted when the rotation of the semiconductor wafer about the dispensing rotation angle is finished.

16. A method for applying developer over a semiconductor wafer having at least one zero-layer alignment mark formed thereon, comprising:
    positioning a nozzle over the semiconductor wafer;
    dispensing a developer over the semiconductor wafer by the nozzle;
    moving the semiconductor wafer to change the projection of the nozzle on the semiconductor wafer from a first boundary line to a second boundary line while the developer is dispensed by the nozzle, wherein the first boundary line and the second boundary line are located at two sides of the zero-layer alignment mark in a circumferential direction of the semiconductor wafer.

17. The method as claimed in claim 16, wherein the projection of the nozzle on the semiconductor wafer is changed by rotating the semiconductor wafer about a dispensing rotation angle, the dispensing rotation angle of the semiconductor wafer is in a range from about 30 degrees to about 40 degrees.

18. The method as claimed in claim 16, wherein about one-tenth of the area of the semiconductor wafer is covered by the developer.

19. The method as claimed in claim 16, wherein the first boundary line and the second boundary line extend from the center of the semiconductor wafer to the outer circumference, and the developer is applied within a fan-shaped region defined by the outer circumference of the semiconductor wafer, the first boundary line and the second boundary line.

20. The method as claimed in claim 16, wherein the first boundary line and the second boundary line are spaced apart from the zero-layer alignment mark by different distances.

* * * * *